(12) United States Patent
Wu

(10) Patent No.: US 9,705,464 B2
(45) Date of Patent: Jul. 11, 2017

(54) AUDIO SIGNAL PROCESSING CIRCUIT

(71) Applicant: HON HAI PRECISION INDUSTRY CO., LTD., New Taipei (TW)

(72) Inventor: Chun-Te Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 36 days.

(21) Appl. No.: 14/956,961

(22) Filed: Dec. 2, 2015

(65) Prior Publication Data

US 2016/0180859 A1 Jun. 23, 2016

(30) Foreign Application Priority Data

Dec. 17, 2014 (CN) .......................... 2014 1 0786838

(51) Int. Cl.
*H03G 3/30* (2006.01)
*G10L 21/0316* (2013.01)
*H03G 5/16* (2006.01)

(52) U.S. Cl.
CPC ....... *H03G 3/3036* (2013.01); *G10L 21/0316* (2013.01); *H03G 5/165* (2013.01)

(58) Field of Classification Search
CPC ... H03G 3/3036; H03G 5/165; G10L 21/0316
USPC ............................................ 381/94.2, 97, 98
See application file for complete search history.

(56) References Cited

U.S. PATENT DOCUMENTS 5,388,159 A * 2/1995 Sakata ............. G11B 20/10527
348/625

FOREIGN PATENT DOCUMENTS

CN 1873777 A 12/2006
CN 102855879 A 1/2013
CN 203279022 U * 11/2013

* cited by examiner

*Primary Examiner* — David Ton
(74) *Attorney, Agent, or Firm* — Steven Reiss

(57) ABSTRACT

An audio signal processing circuit includes a first obtaining unit, a regulation unit, a second obtaining unit, and a synthesis unit. The first obtaining unit obtains high-frequency audio signals from original audio signals. The regulation unit obtains a volume of the original signals and amplifies the high-frequency signals according to an amplification factor having a positive correlation with the volume of the original audio signals, to output improved audio components. The second obtaining unit obtains reference audio signals from the original audio signals. The synthesis unit synthesizes the improved audio components and the reference audio signals to output improved audio signals.

10 Claims, 4 Drawing Sheets

US 9,705,464 B2

AUDIO SIGNAL PROCESSING CIRCUIT

CROSS-REFERENCE TO RELATED APPLICATIONS

This application claims priority to Chinese Patent Application No. 201410786838.8 filed on Dec. 17, 2014, the contents of which are incorporated by reference herein.

FIELD

The subject matter herein generally relates to audio signal processing circuits, and particularly to audio signal processing circuits improving original audio signals.

BACKGROUND

Most televisions output audio signals by the audio chip inside the televisions, and the audio chip transmits the audio signals to a loudspeaker directly, to drive the loudspeaker sounding. However, when the video compression rate is relatively high, if the audio chip transmits the audio signals to the loudspeaker directly will sound unpleasant.

BRIEF DESCRIPTION OF THE DRAWINGS

Implementations of the present technology will now be described, by way of example only, with reference to the attached figures.

DETAILED DESCRIPTION

Figure 1:
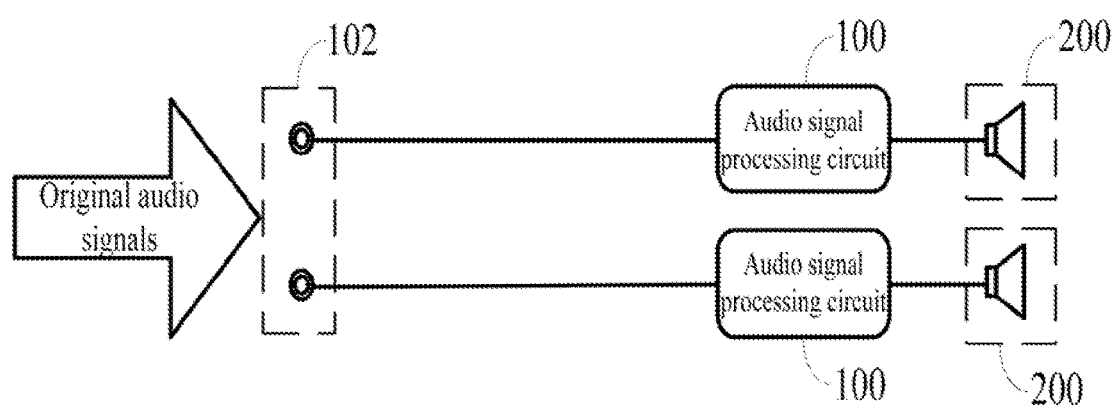
FIG. 1 is a diagrammatic view of an application of a first embodiment of an audio signal processing circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "comprising," when utilized, means "including, but not necessarily limited to"; it specifically indicates open-ended inclusion or membership in the so-described combination, group, series and the like.

Figure 2:
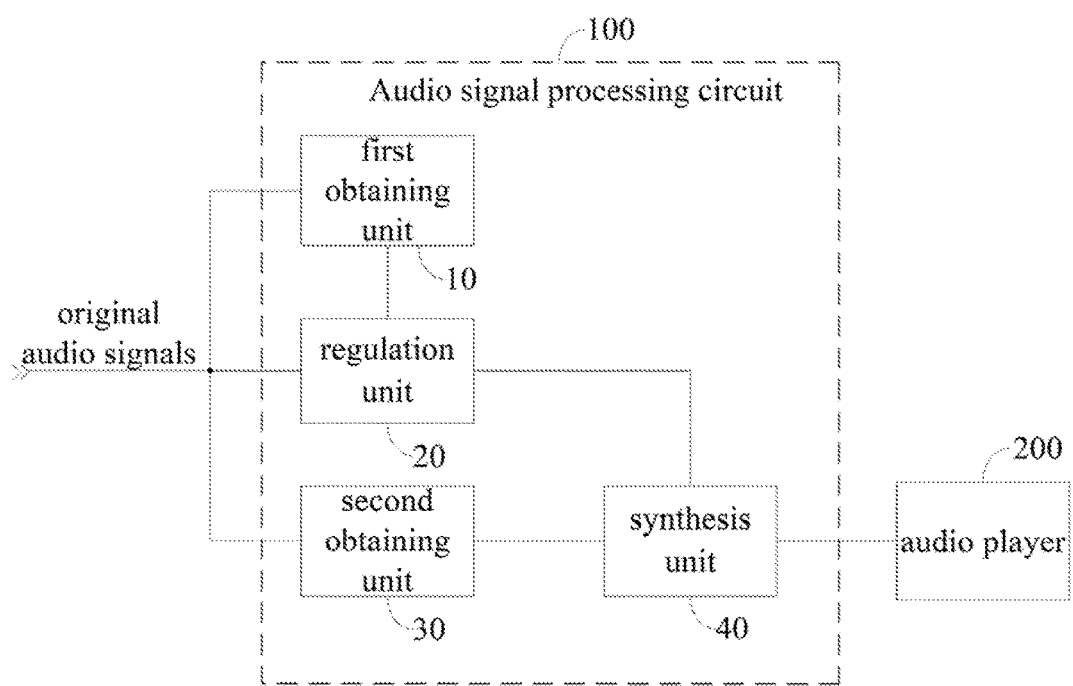
FIG. 2 is a block diagram of a first embodiment of the audio signal processing circuit of FIG. 1.

FIG. 2 illustrates a first embodiment of an audio signal processing circuit 100. In at least one embodiment, the audio signal processing circuit 100 improves the sound quality of original audio signals, and outputs the improved audio signals to an audio player 200. In this disclosure the audio player 200 can be a component capable of outputting sound, such as a loudspeaker. The audio signal processing circuit 100 can be in televisions, set-top boxes, mobile phones, and other electrical devices capable of audio playing. The audio signal processing circuit 100 receives the original audio signals output by a sound processing chip 102 which is set in the electrical devices, and improves the sound quality output from the original audio signals.

As shown in FIG. 1, in at least one embodiment, the original audio signals comprise high frequency audio signals, intermediate frequency audio signals, low frequency audio signals, and extremely low frequency audio signals. Herein the high frequency audio signals are audio signals with a frequency of above 8 KHZ, and the extremely low frequency audio signals are audio signals with a frequency of less than 100 HZ. In actual circuit design, since heated electrical parts cause thermal noise when working, the original audio signals will be mixed with the thermal noise of the electronic parts during transmission, and the thermal noise can be additive the additive white Gaussian noise.

The audio signal processing circuit 100 comprises a first obtaining unit 10, a regulation unit 20, a second obtaining unit 30, and a synthesis unit 40. The first obtaining unit 10 obtains high-frequency audio signals from original audio signals. The regulation unit 20 is connected to the first obtaining unit 10. The regulation unit 20 obtains the volume of the original audio signals and amplifies the high-frequency audio signals of the first obtaining unit 10 by a positive correlation with the volume of the original audio signals, in order to output improved audio component.

The second obtaining unit 30 filters the high-frequency audio signals from the original audio signals to obtain reference audio signals. The synthesis unit 40 is connected to the regulation unit 20 and the second obtaining unit 30. The synthesis unit 40 superimposes the improved audio components on the reference audio signals, to generate improved audio signals, the improved audio signals being output to the audio player 200.

In at least one embodiment, the first obtaining unit 10 further obtains the additive the additive white Gaussian noise from the original audio signals. The regulation unit 20 further amplifies the high frequency audio signals obtained by the first obtaining unit 10 and the additive white Gaussian noise by a positive correlation with the volume of the original audio signals, in order to output improved audio components to the synthesis unit 40.

In at least one embodiment, the first obtaining unit 10 further amplifies the high frequency audio signals, or mixed signals after addition of the additive white Gaussian noise to the high frequency audio signals (Gaussian mixed signals), with a predetermined amplification factor, and then outputs the signals to the regulation unit 20. A predetermined amplification factor can be preset and adjusted according to the application of the audio signal processing circuit 100.

In at least one embodiment, the higher the volume of the original audio signals obtained by the regulation unit 20, the higher will be amplification factor of the high frequency audio signals, or the Gaussian mixed signals. That is, the higher the volume of the original audio signals, the more improved will be the output audio signals. The original audio signals with high volume mix the high frequency audio signals with relatively large amplitude, or mix the Gaussian mixed signals in the process of improving sound quality.

Figure 3:
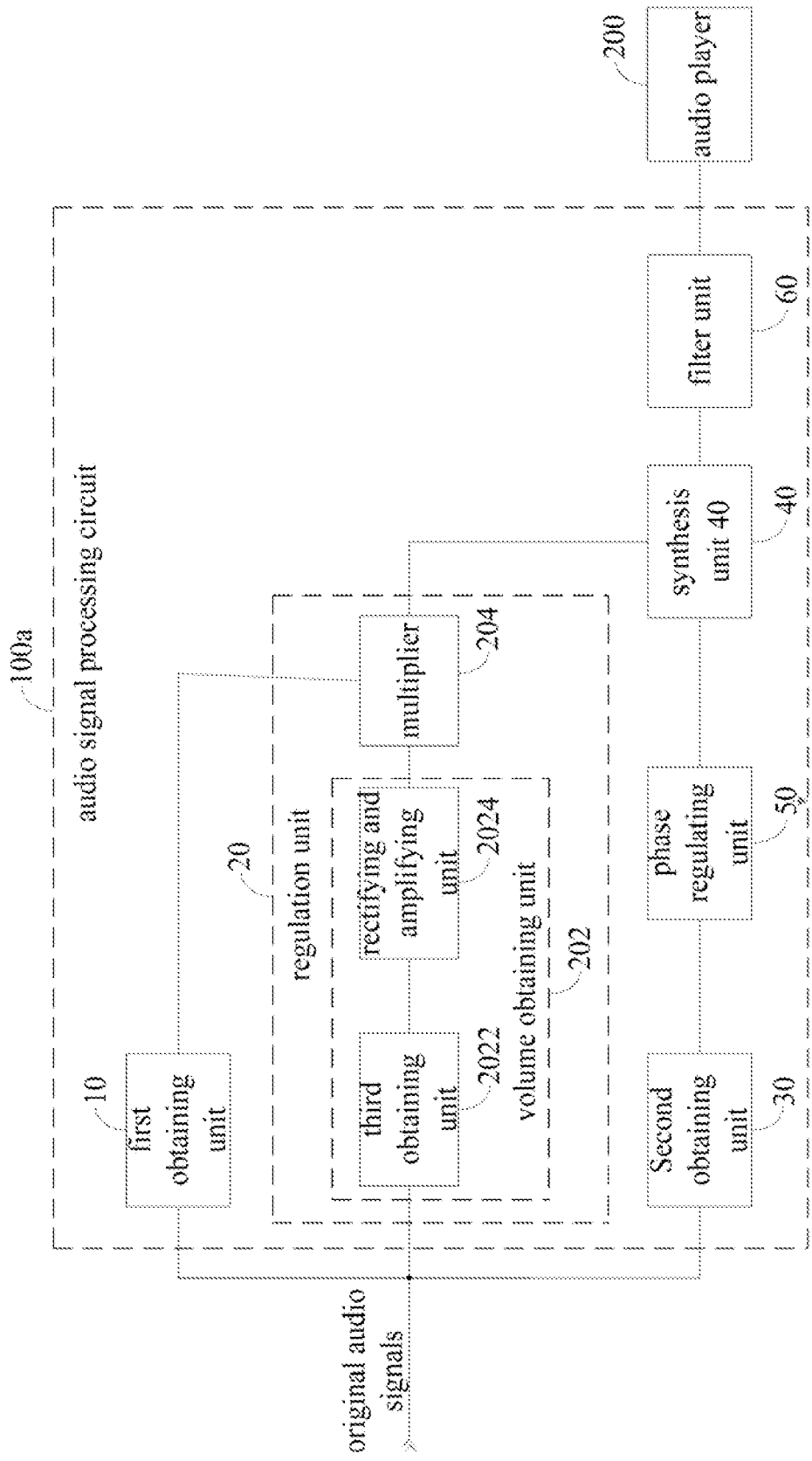
FIG. 3 is a block diagram of a second embodiment of the audio signal processing circuit of FIG. 1.

FIG. 3 illustrates a second embodiment of an audio signal processing circuit 100a. In at least one embodiment, the audio signal processing circuit 100a is similar to the audio signal processing circuit 100 shown in FIG. 1, but the audio signal processing circuit 100a further comprises a phase regulating unit 50 and a filter unit 60. The regulation unit 20 further comprises a volume obtaining unit 202 and a multiplier unit 204. The volume obtaining unit receives the original audio signals and obtains the volume of the original audio signals. The high frequency audio signals of the first obtaining unit 10 or the Gaussian mixed signals are two-quadrant multiplied by the volume of the original audio signals through the multiplier unit 204. Thus the multiplier unit 204 amplifies the high-frequency audio signals or the Gaussian mixed signals by a positive correlation with the volume of the original audio signals.

In at least one embodiment, the volume obtaining unit 202 comprises a third obtaining unit 2022 and a rectifying and amplifying unit 2024. The third obtaining unit 2022 obtains the extremely low frequency audio signals from the original audio signals. The rectifying and amplifying unit 2024 is connected to the third obtaining unit 2022. The rectifying and amplifying unit 2024 rectifies and amplifies the extremely low frequency audio signals obtained by the third obtaining unit 2022, to obtain the volume of the original audio signals. The volume obtained by the volume obtaining unit 202 is a positive quantity. The high frequency audio signals of the first obtaining unit 10 or the Gaussian mixed signals are two-quadrant multiplied by the positive volume through the multiplier unit 204.

The phase regulating unit 50 is connected to the second obtaining unit 30 to regulate the phase of the reference audio signals output by the second obtaining unit 30. In at least one embodiment, the phase regulating unit 50 adjusts the reference audio signals by phasing the same through 180°. The synthesis unit 40 superimposes the improved audio components output by the multiplier unit 204 onto the reference audio signals regulated by the phase regulating unit 50, to generate improved audio signals.

The filter unit 60 is connected to the synthesis unit 40. The filter unit 60 filters the improved audio signals output by the synthesis unit 40 to filter or cancel audio signals with a predetermined frequency, in order to drive the audio player 200. Herein the filter unit 60 is a low pass filter.

Since the extremely low frequency audio signals have the features of slow changes and ease of sampling, the audio signal processing circuit 100a obtains the extremely low frequency audio signals from the original audio signals through the volume obtaining unit 202, and then processes the extremely low frequency audio signals to represent the volume of the original audio signals. In at least one embodiment, the audio signal processing circuit 100a further obtains the low frequency audio signals or the intermediate audio signals from the original audio signals through the volume obtaining unit 202, and then processes the low frequency audio signals or the intermediate audio signals to represent the volume of the original audio signals.

Figure 4:
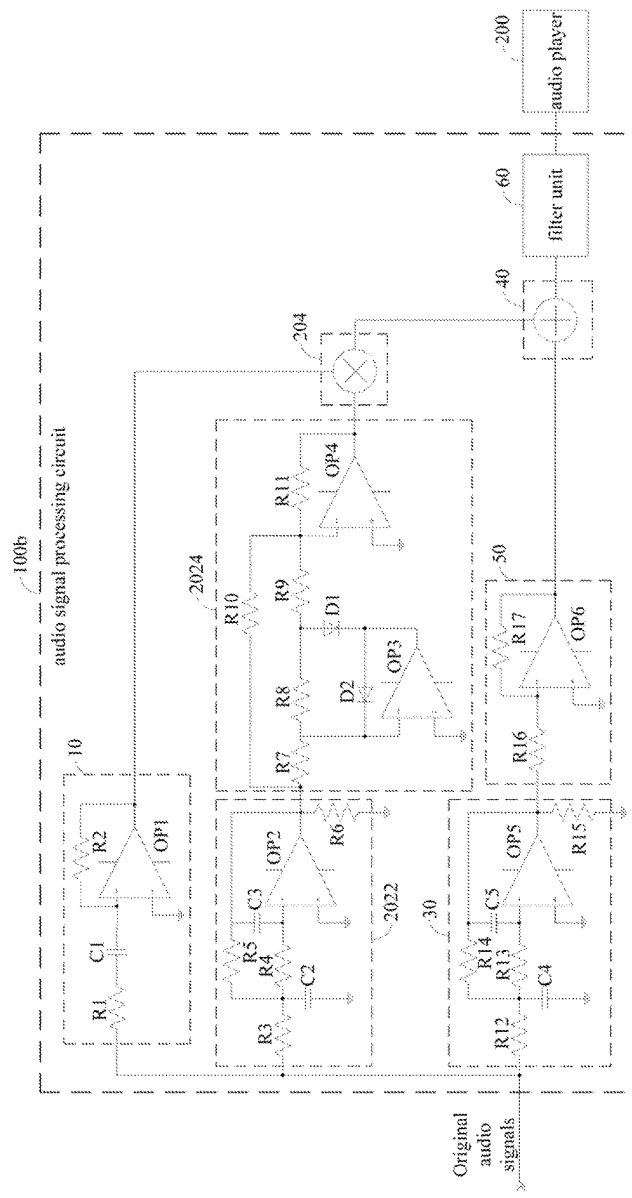
FIG. 4 is a circuit diagram of an embodiment of the audio signal processing circuit of FIG. 2.

FIG. 4 illustrates a first embodiment of an audio signal processing circuit 100b. In at least one embodiment, the first obtaining unit 10 comprises a first resistor R1, a second resistor R2, a first capacitor C1, and a first operational amplifier OP1. One end of the first resistor R1 receives the original audio signals, and the other end of the first resistor R1 is connected to the one end of the first capacitor C1. The first operational amplifier OP1 comprises a non-inverting input, an inverting input, and an output. The non-inverting input of the first operational amplifier OP1 is connected to ground, and the inverting input of the first operational amplifier OP1 is connected to the other end of the first capacitor C1. The output of the first operational amplifier OP1 is connected to the multiplier unit 204. The second resistor R2 is connected between the inverting input of the first operational amplifier OP1 and the output of the first operational amplifier OP1. The first obtaining unit 10 obtains a amplification factor of the high frequency audio signal and the additive white Gaussian noise by adjusting value of the resistor R1 and the resistor R2.

In at least one embodiment, the first obtaining unit 10 comprises a first capacitor C1 and a first operational amplifier OP1. The first operational amplifier OP1 comprises a non-inverting input, an inverting input, and an output. One end of the first capacitor C1 receives the original audio signals. The non-inverting input of the first operational amplifier OP1 is connected to ground, and the inverting input of the first operational amplifier OP1 is connected to the other end of the first capacitor C1. The output end of the first operational amplifier OP1 is connected to the inverting input and the multiplier unit 204.

The third obtaining unit 2022 comprises a third resistor R3, a fourth resistor R4, a fifth resistor R5, a sixth resistor R6, a second capacitor C2, a third capacitor C3, and a second operational amplifier OP2. One end of the third resistor R3 receives the original audio signals, and the other end of the third resistor R3 is connected to one end of the fourth resistor R4. The second operational amplifier OP2 comprises a non-inverting input, an inverting input, and an output. The non-inverting input of the second operational amplifier OP2 is connected to ground, and the inverting input of the second operational amplifier OP2 is connected to the other end of the fourth capacitor C4. The output of the second operational amplifier OP2 is connected to the rectifying and amplifying unit 2024.

One end of the second capacitor C2 is connected to a node between the third resistor R3 and the fourth resistor R4, and the other end of the second capacitor C2 is connected to ground. One end of the fifth resistor R5 is connected to a node between the third resistor R3 and the fourth resistor R4, and the other end of the fifth resistor R5 is connected the output of the second operational amplifier OP2. The third capacitor C3 is connected between the inverting input of the second operational amplifier OP2 and the output of the second operational amplifier OP2. One end of the sixth resistor R6 is connected the output of the second operational amplifier OP2, the other end of the sixth resistor R6 is connected to ground.

In at least one embodiment, the third obtaining unit 2022 also can comprise a third resistor R3 and a second operational amplifier OP2. The second operational amplifier OP2 comprises a non-inverting input, an inverting input, and an output. One end of the third resistor R3 is connected to ground. The non-inverting input of the second operational amplifier OP2 is connected to ground, and the inverting input of the second operational amplifier OP2 is connected to the other end of the third resistor R3. The output of the second operational amplifier OP2 is connected to the rectifying and amplifying unit 2024 and the inverting input of the second operational amplifier OP2.

The rectifying and amplifying unit 2024 comprises a seventh resistor R7, an eighth resistor R8, a ninth resistor R9, a tenth resistor R10, an eleventh resistor R11, a first diode D1, a second diode D2, a third operational amplifier OP3, and a fourth operational amplifier OP4. One end of the seventh resistor R7 is connected to output of the second operational amplifier OP2, the other end of the seventh resistor R7 is connected to one end of the eighth resistor R8. The other end of the eighth resistor R8 is connected to one end of the ninth resistor R9.

The third operational amplifier OP3 comprises a non-inverting input, an inverting input, and an output. The non-inverting input of the third operational amplifier OP3 is connected to ground, and the inverting input of the third operational amplifier OP3 is connected between the seventh resistor R7 and the eighth resistor R8. A cathode of the first diode D1 is connected between the eighth resistor R8 and the ninth resistor R9, an anode of the first diode D1 is connected to the output of the third operational amplifier OP3. An anode of the second diode D2 is connected to the output of the third operational amplifier OP3 and a cathode of the second diode D2 is connected to the inverting input of the third operational amplifier OP3.

One end of the tenth resistor R10 is connected to one end of the seventh resistor R7, the other end of the tenth resistor R10 is connected to the other end of the ninth resistor R9. The fourth operational amplifier OP4 comprises a non-inverting input, an inverting input, and an output. The non-inverting input of the fourth operational amplifier OP4 is connected to ground, and the inverting input of the fourth operational amplifier OP4 is connected between the ninth resistor R9 and the tenth resistor R10. The output of the fourth operational amplifier OP4 is connected to the multiplier unit 204. The eleventh resistor R11 is connected between the inverting input of the fourth operational amplifier OP4 and the output of the fourth operational amplifier OP4.

In at least one embodiment, the rectifying and amplifying unit 2024 comprises an eighth resistor R8, a first diode D1, a second diode D2, a third operational amplifier OP3, and a fourth operational amplifier OP4. One end of the eighth resistor R8 is connected to the third obtaining unit 2022. The third operational amplifier OP3 comprises a non-inverting input, an inverting input, and an output. The non-inverting input of the third operational amplifier OP3 is connected to ground, and the inverting input of the third operational amplifier OP3 is connected between the eighth resistor R8 and the third obtaining unit 2022. An anode of the first diode D1 is connected to the output of the third operational amplifier OP3, a cathode of the first diode D1 is connected to the inverting input of the third operational amplifier OP3. An anode of the second diode D2 is connected to the other end of the eighth resistor R8 and a cathode of the second diode D2 is connected to the output of the third operational amplifier OP3. The fourth operational amplifier OP4 comprises a non-inverting input, an inverting input, and an output. The non-inverting input of the fourth operational amplifier OP4 is connected to ground, and the inverting input of the fourth operational amplifier OP4 is connected between the eighth resistor R8 and the second diode D2. The output of the fourth operational amplifier OP4 is connected to the inverting input of the fourth operational amplifier OP4 and the multiplier unit 204.

Signals output by the first operational amplifier OP1 are multiplied by the signals output by the fourth operational amplifier OP4 through the multiplier unit 204, to output improved audio components.

The second obtaining unit 30 comprises a twelfth resistor R12, a thirteenth resistor R13, a fourteenth resistor R14, a fifteenth resistor R15, a fourth capacitor C4, a fifth capacitor C5, and a fifth operational amplifier OP5. One end of the twelfth resistor R12 receives the original audio signals, the other end of the twelfth resistor R12 is connected to one end of the thirteenth resistor R13. The fifth operational amplifier OP5 comprises a non-inverting input, an inverting input, and an output. The non-inverting input of the fifth operational amplifier OP5 is connected to ground, the inverting input of the fifth operational amplifier OP5 is connected to the other end of the thirteenth resistor R13, and the output of the fifth operational amplifier OP5 is connected to the phase regulating unit 50.

One end of the fourteenth resistor R14 is connected between the twelfth resistor R12 and the thirteenth resistor R13 and the other end of the fourteenth resistor R14 is connected to the output of the fifth operational amplifier OP5. One end of the fourth capacitor C4 is connected between the twelfth resistor R12 and the thirteenth resistor R13 and the other end of the fourth capacitor C4 is connected to ground. The fifth capacitor C5 is connected between the inverting input of the fifth operational amplifier OP5 and the output of the fifth operational amplifier OP5. One end of the fifteenth resistor R15 is connected to the output of the fifth operational amplifier OP5 and the other end of the fifteenth resistor R15 is connected to ground.

In at least one embodiment, the second obtaining unit 30 also can comprise a twelfth resistor R12 and a fifth operational amplifier OP5. One end of the twelfth resistor R12 receives the original audio signals. The fifth operational amplifier OP5 comprises a non-inverting input, an inverting input, and an output. The non-inverting input of the fifth operational amplifier OP5 is connected to ground, the inverting input of the fifth operational amplifier OP5 is connected to the other end of the twelfth resistor R12, and the output of the fifth operational amplifier OP5 is connected to the phase regulating unit 50.

The phase regulating unit 50 comprises a sixteenth resistor R16, a seventeenth resistor R17, and the sixth operational amplifier OP6. One end of the sixteenth resistor R16 is connected to the output of the fifth operational amplifier OP5. The sixth operational amplifier OP6 comprises a non-inverting input, an inverting input, and an output. The non-inverting input of the sixth operational amplifier OP6 is connected to ground and the inverting input of the sixth operational amplifier OP6 is connected to the other end of the sixteenth resistor R16. The output of the sixth operational amplifier OP6 is connected to the synthesis unit 40. The seventeenth resistor R17 is connected between the inverting input of the sixth operational amplifier OP6 and the output of the sixth operational amplifier OP6.

In at least one embodiment, the phase regulating unit 50 also can comprise a sixth operational amplifier OP6. The sixth operational amplifier OP6 comprises a non-inverting input, an inverting input, and an output. The non-inverting input of the sixth operational amplifier OP6 is connected to ground, the inverting input of the sixth operational amplifier OP6 is connected to the second obtaining unit 30, and the output of the sixth operational amplifier OP6 is connected to the synthesis unit 40.

In at least one embodiment, the synthesis unit 40 is an adder. The synthesis unit 40 superimposes the improved audio components which are output by the multiplier unit 204 onto the reference audio signals regulated by the phase regulating unit 50, to generate improved audio signals.

Many details are often found in the art such as the other features of audio signal processing circuit. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An audio signal processing circuit comprising:
a first obtaining unit configured to obtain high-frequency audio signals from original audio signals;
a regulation unit coupled to the first obtaining unit configured to obtain a volume of the original audio signals and to amplify the high-frequency audio signals of the first obtaining unit by a positive correlation with the volume of the original audio signals, in order to output improved audio components;
a second obtaining unit configured to filter the high-frequency audio signals from the original audio signals, to obtain reference audio signals; and
a synthesis unit coupled to the regulation unit and the second obtaining unit to superimpose the improved audio components onto the reference audio signals to generate improved audio signals.

2. The audio signal processing circuit of claim 1, wherein the first obtaining unit is further configured to obtain additive white Gaussian noise from the original audio signals, the regulation unit is further configured to amplify the additive white Gaussian noise by a positive correlation with the volume of the original audio signals, and to superimpose the amplified additive white Gaussian noise onto the amplified high-frequency signals, to output the improved audio components.

3. The audio signal processing circuit of claim 2, wherein the first obtaining unit is further configured to amplify the high-frequency audio signals and the additive white Gaussian noise with a predetermined amplification factor, and output the amplified high-frequency audio signals and the additive white Gaussian noise to the regulation unit.

4. The audio signal processing circuit of claim 3, wherein the first obtaining unit comprises:
a first capacitor with one end to receive the original audio signals;
a first operational amplifier with a non-inverting input end coupled to ground, an inverting input coupled to the other end of the first capacitor and the output end, and an output end coupled to the regulation unit.

5. The audio signal processing circuit of claim 1, wherein the regulation unit comprises:
a volume obtaining unit to obtain the volume of the original audio signals; and
a multiplier unit, wherein the high frequency audio signals obtained by the first obtaining unit are multiplied by the volume of the original audio signals through the multiplier unit, to amplify the high-frequency audio signals by a positive correlation with the volume of the original audio signals.

6. The audio signal processing circuit of claim 5, wherein the reference audio signals comprise intermediate frequency audio signals, low-frequency audio signals and extremely low frequency audio signals, wherein the volume obtaining unit comprises:
a third obtaining unit to obtain the extremely low frequency audio signals from the original audio signals; and
a rectifying and amplifying unit to full-wave rectify and amplify the extremely low frequency audio signals, to obtain the volume of the original audio signals.

7. The audio signal processing circuit of claim 6, wherein the third obtaining unit comprises:
a first resistor with one end to receive the original audio signals; and
a second operational amplifier with a non-inverting input coupled to ground, an inverting input coupled to the other end of the first resistor, and an output end coupled to the inverting input and the rectifying and amplifying unit.

8. The audio signal processing circuit of claim 6, wherein the rectifying and amplifying unit comprises:
a second resistor with one end coupled to the third obtaining unit;
a third operational amplifier comprising a non-inverting input, an inverting input and an output, wherein the non-inverting input is coupled to ground, and the inverting input is coupled between the second resistor and the third obtaining unit;
a first diode with an anode coupled to the output of the third operational amplifier, a cathode connected to the inverting input of the third operational amplifier;
a second diode with an anode coupled to the other end of the second resistor, a cathode coupled to the output of the third operational amplifier; and
a fourth operational amplifier with a non-inverting input coupled to ground, an inverting input coupled between the second resistor and the second diode, and an output coupled to the multiplier unit and the inverting input of fourth operational amplifier.

9. The audio signal processing circuit of claim 1, further comprising a phase regulating unit to regulate phase of the reference audio signals output by the second obtaining unit, wherein the synthesis unit is further configured to superimpose the improved audio components onto regulated reference audio signals, to generate the improved audio signals.

10. The audio signal processing circuit of claim 1, wherein the phase regulating unit comprises a fifth operational amplifier with a non-inverting input coupled to ground, an inverting input coupled to the second obtaining unit, and an output coupled to the synthesis unit and the inverting input of the fifth operational amplifier.

* * * * *